United States Patent [19]

Wright et al.

[11] Patent Number: 5,796,266

[45] Date of Patent: Aug. 18, 1998

[54] CIRCUIT AND A METHOD FOR CONFIGURING PAD CONNECTIONS IN AN INTEGRATED DEVICE

[75] Inventors: Jeffrey P. Wright; Hua Zheng, both of Boise, Id.

[73] Assignee: Micron Technology, Inc., Boise, Id.

[21] Appl. No.: 619,261

[22] Filed: Mar. 18, 1996

[51] Int. Cl.[6] .................................................. G01R 31/02
[52] U.S. Cl. ............................................................ 324/763
[58] Field of Search ................................. 324/763, 158.1, 324/765; 371/22.5, 22.6

[56] References Cited

U.S. PATENT DOCUMENTS

| | | |
|---|---|---|
| 4,339,710 | 7/1982 | Hapke ........................................ 324/763 |
| 4,398,146 | 8/1983 | Draheim et al. ......................... 324/765 |
| 4,698,588 | 10/1987 | Hwang et al. ........................... 324/158.1 |
| 4,743,841 | 5/1988 | Takeuchi ................................... 324/763 |
| 5,107,208 | 4/1992 | Lee ........................................... 324/158.1 |
| 5,301,143 | 4/1994 | Ohri et al. ................................ 365/96 |
| 5,469,075 | 11/1995 | Oke et al. ................................. 324/763 |

Primary Examiner—Ernest F. Karlsen
Assistant Examiner—Anh Phung
Attorney, Agent, or Firm—Seed and Berry LLP

[57] ABSTRACT

An integrated device includes a configuration circuit that is coupled to first and second bond pads and first and second conductive paths of the integrated device. The circuit receives a map signal that has a first value during a first operational mode of the integrated device and a second value during a second operational mode of the integrated device. In response to the first value, the circuit couples the first pad to the second conductive path. In response to the second value, the circuit couples the first pad to the first conductive path and the second pad to the second conductive path. The first operational mode may be a wafer test mode.

21 Claims, 3 Drawing Sheets

CIRCUIT AND A METHOD FOR CONFIGURING PAD CONNECTIONS IN AN INTEGRATED DEVICE

DESCRIPTION

TECHNICAL FIELD

The present invention relates generally to electronic devices, and more specifically, to a circuit for dynamically configuring bond-pad connections for different operational modes of an integrated circuit.

BACKGROUND OF THE INVENTION

Referring to FIG. 1, one or more dies 2 are formed in a conventional manner on a wafer 4, which is formed from a semiconductor material such as silicon. The dies 2 are integrated circuits or devices that have been formed, but have not been detached from the wafer 4. For clarity, only one row of dies 2 is shown, but will be understood that generally multiple rows of dies 2 are formed to substantially fill the surface of the wafer 4. During a wafer test procedure, conventional apparatus (not shown) electrically tests the dies 2. The testing apparatus includes probes that contact selected ones of the bond pads (not shown) of the dies 2.

A limitation associated with such a wafer test procedure is that each bond pad that will receive a signal from the testing apparatus often must be placed only along the sides 8 of the dies 2 in order to perform simultaneously testing of multiple dies 2. Because the dies 2 are placed relatively close together along their sides 6 to maximize the area of the wafer 4 occupied by the dies 2, the bond pads that are located along the adjacent sides 6 are often inaccessible to the probes of the testing apparatus, particularly when all of the dies 2 on the wafer 4 are tested simultaneously. That is, the probes of the testing apparatus can often only contact the accessible bond pads that are located along the other sides 8 of the dies 2. (The dies 2 are typically formed in the wafer 4 such that there is sufficient clearance for the test probes to access the sides 8 of each of the dies 2.) Requiring the bond pads that are used during the wafer test procedure to be located only along the sides 8 may cause inefficient and complex circuit layouts on and increase the areas of the dies 2.

Referring to FIG. 2, which shows a top view of a die 2 of FIG. 1, a known solution to this limitation is discussed. For clarity, the wafer 4 and the remaining dies 2 of FIG. 1 are omitted from FIG. 2. The die 2 includes accessible test pads 10 and accessible bond pads 14, which are located along accessible sides 8, and inaccessible pads 12, which are located along inaccessible sides 6. For clarity, FIG. 2 shows only two test pads 10a and 10b, two inaccessible bond pads 12a and 12b, and two accessible bond pads 14a and 14b, it being understood that the die 2 may include more or less of each of these pads. Each test pad 10 is electrically coupled to circuitry (not shown) that is coupled to a corresponding pad 12 and that is to receive a signal from the testing apparatus during a wafer test procedure. Thus, by physically accessing test pads 10, the testing apparatus can electrically access the circuitry that is coupled to the inaccessible pads 12. Once the test is complete, however, the pads 10 typically serve no further purpose.

A limitation of this known solution is that the length of the accessible sides 8 must be sufficient to accommodate the required number of the pads 14 and the test pads 10. Thus, the test pads 10 often increase the length of the sides 8, and thus often increase the area of the die 2.

SUMMARY OF THE INVENTION

In accordance with an aspect of the present invention, an integrated device is provided. The integrated device includes a circuit that is coupled to first and second bond pads and first and second conductive paths of the integrated device. The circuit receives a map signal that has a first value during a first operational mode of the integrated device and a second value during a second operational mode of the integrated device. In response to the first value, the circuit couples the first pad to the second conductive path. In response to the second value, the circuit couples the first pad to the first conductive path and the second pad to the second conductive path.

An advantage provided by one aspect of the invention is a reduction in the number of test pads required in a die.

An advantage provided by another aspect of the invention is a reduction in the area of a die.

DETAILED DESCRIPTION OF THE INVENTION

Figure 3:
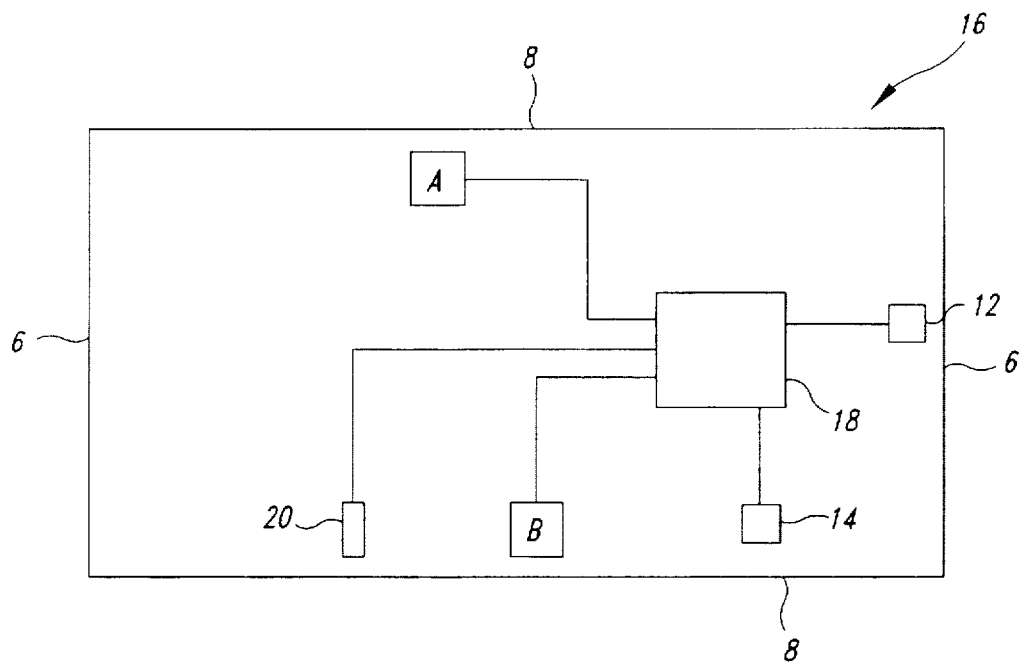
FIG. 3 is a top plan view of a die formed in accordance with the present invention.

FIG. 3 is a top plan view of a die 16 that is formed in accordance with the present invention. For clarity, the wafer in which the die 16 is formed, and the other dies formed in the wafer, are omitted. The die 16 includes sides 8, which are accessible to a testing apparatus (not shown), and sides 6, which are substantially inaccessible to the testing apparatus during certain testing procedures, such as simultaneous testing of multiple dies 2. One or more bond pads 12 and 14 are located along the sides 6 and 8, respectively. For clarity, FIG. 3 shows only one inaccessible pad 12 and one accessible pad 14. A conventional circuit B is coupled to the pad 12 while the circuitry of the die 16 is in a first or normal mode of operation. In order to test the circuit B, a test signal must be applied to the circuit B. However, the pad 12 that is coupled to the circuit B is inaccessible and thus cannot be used to apply the test signal to the circuit B. A conventional circuit A is coupled to the pad 14. The circuit A is of the type that either need not be tested or need not be tested at the same time that the circuit B is being tested. Since the pad 14 is not needed by the circuit A during the testing of the circuit B, the pad 14 can be temporarily connected to the circuit B during a testing procedure while the circuitry of the die 16 is in a second or test mode of operation to allow test signals to be applied to the circuit B. (For purposes of the invention, the details of the structure and operation of the circuits A and B are unimportant and therefore these circuits are not discussed in detail.) The pad 14 cannot be omitted from the die 16, however, because it is used in the first and other operating modes of the integrated circuit formed on the die 16. A configuration circuit 18, described in detail below, is used to connect the pad 14 to the circuit B during the test mode for the circuit B. The operation of the configuration circuit 18 is controlled by a configuration or map signal that is applied to a configure or map pad 20 by external means.

Figure 1:
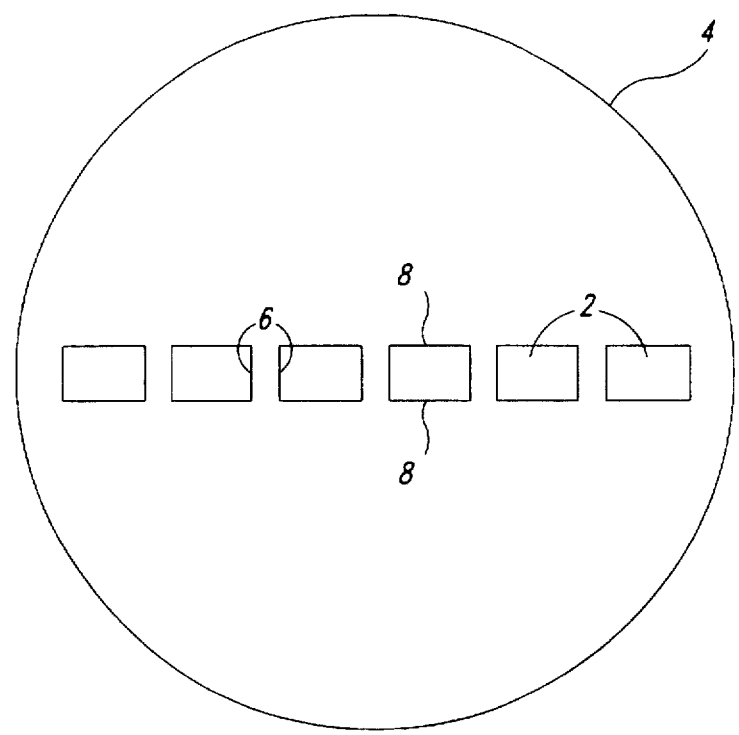
FIG. 1 is a top plan view of a semiconductor wafer having dies formed thereon as is known in the art.
Figure 2:
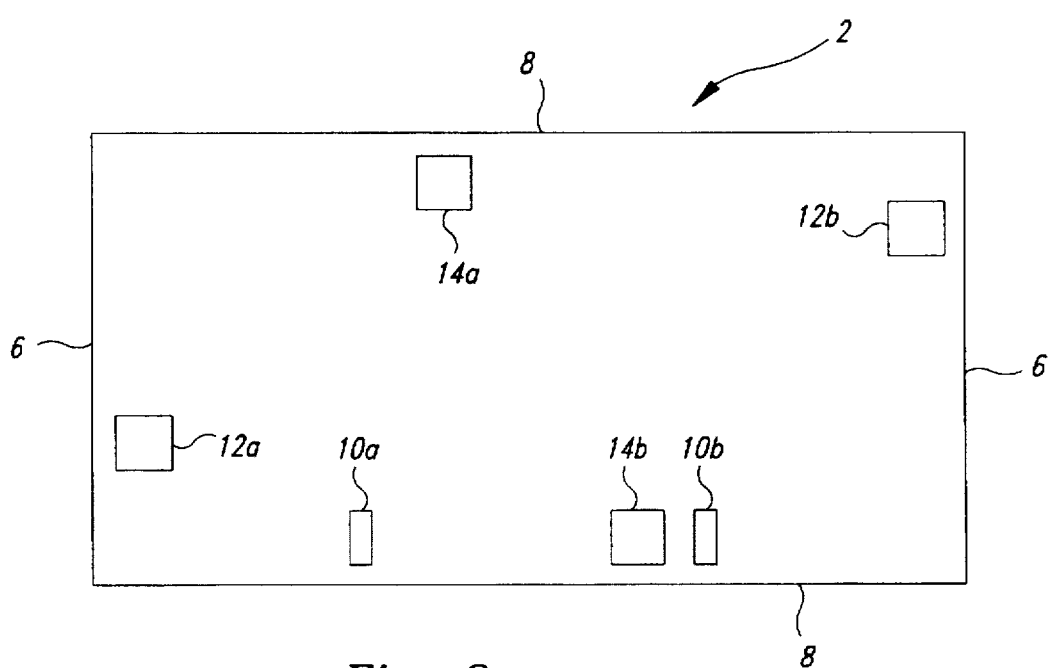
FIG. 2 is a top plan view of a die of FIG. 1.

The map pad 20, which may be similar in size and construction to the known test pads 10 (FIG. 2), is disposed along one of the accessible sides 8.

In operation during testing of the die 16, the test apparatus drives the map pad 20 with a configure or map signal. In response to this map signal, the configuration circuit 18 couples or maps the unused pad 14 to the circuit B, which is normally driven by signals that are applied to the used pad 12. That is, the circuit 18 configures the connections of the pads 12 and 14 so that the testing apparatus can drive the circuit B via the accessible but unused pad 14. Therefore, by using one map pad 20 and one or more unused pads 14, one can reduce the number of or eliminate altogether the test pads 10 (FIG. 2), and thus reduce the area of the die 16 as compared with that of known dies.

Figure 4:
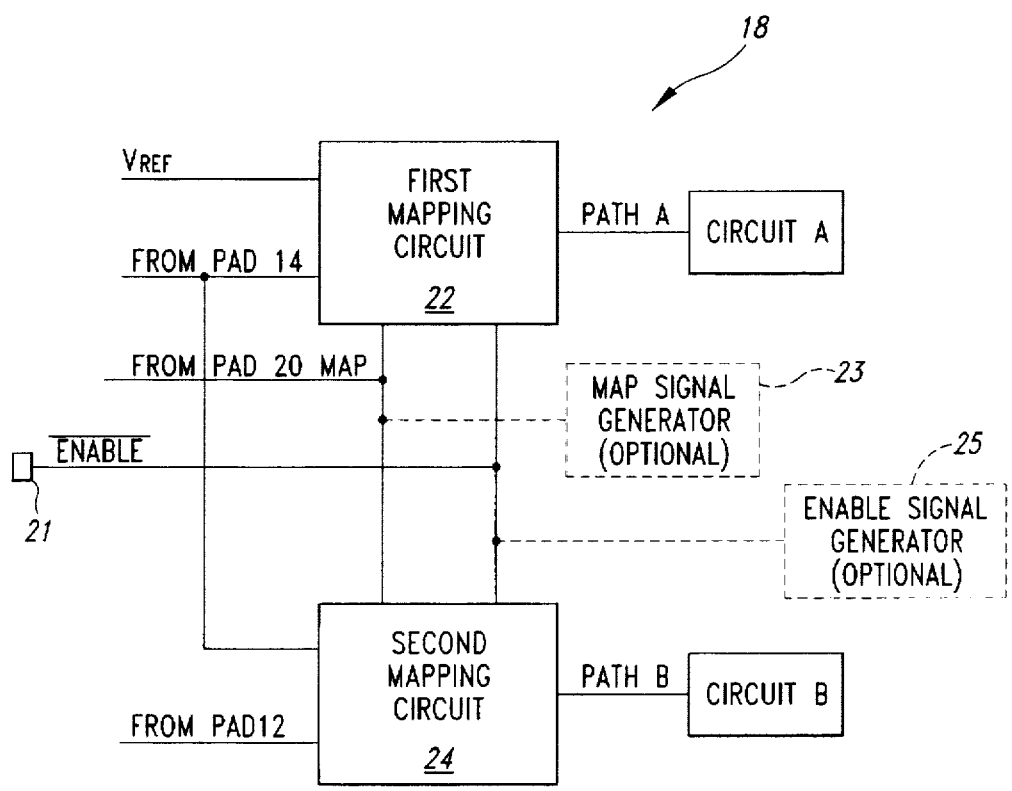
FIG. 4 is a block diagram of one embodiment of the configuration circuit of FIG. 3.

FIG. 4 is a block diagram of one embodiment of the configuration circuit 18 of FIG. 3. The circuit 18 includes a first mapping or switching circuit 22 that has a first signal terminal coupled to a reference voltage VREF, a second signal terminal coupled to the accessible but unused pad 14, a first control terminal coupled to the map pad 20, a second control terminal coupled to an enable signal generator, here a pad 21, that provides a signal $\overline{\text{ENABLE}}$, and a third signal terminal coupled to a conductive path or signal conductive path A. The signal conductive path A is also coupled to the conventional circuit A. The bar over $\overline{\text{ENABLE}}$ indicates that it is active at a low logic level, i.e., logic 0. The circuit 18 also includes a second mapping or switching circuit 24 that has a first signal terminal coupled to the pad 14, a second signal terminal coupled to the inaccessible but used pad 12, a first control terminal coupled to the map pad 20, a second control terminal coupled to the enable pad 21, and a third signal terminal coupled to a conductive path or signal conductive path B. The signal conductive path B is also coupled to the conventional circuit B.

In operation, during the first or normal operational mode of the integrated circuit on the die 16, the circuit 18 couples the pad 12 to the circuit B and couples the pad 14 to the circuit A. The pad 20 is driven with a first logic level to indicate this first mode of operation. Because many or all of the first and other nonwafer-test operational modes are implemented after the die 16 has been packaged, and because one often lacks access to the pads 20 and 21 after the die 16 is packaged, optional and conventional map signal and enable signal generator circuits 23 and 25, respectively, are often formed on the die 16 to drive the pad 20 with the map signal and the pad 21 with $\overline{\text{ENABLE}}$. An example of such generators 23 and 25 includes conventional pull-up or pull-down resistors or latches. If such generators 23 and 25 are used, the map pad 20 and the enable pad 21 may be eliminated, and the map signal and enable signal generators 23 and 25 may be directly coupled to the appropriate internal nodes. When present and driven externally, the map pad 20 and the enable pad 21 may themselves be considered map signal and enable signal generators, respectively. Furthermore, the optional map signal generator 23 may also be referred to as a test signal generator, since it controls the mapping circuit 24 to couple the pad 14 to the circuit B during a test mode. For example purposes, it is assumed that the map pad 20 and the enable pad 21 are present. In response to this first logic level and a logic 0 for $\overline{\text{ENABLE}}$, the first mapping circuit 22 couples the pad 14 to the circuit A via the signal conductive path A, and the second mapping circuit 24 couples the pad 12 to the circuit B via the signal conductive path B.

In operation, the second or wafer-test procedure of the integrated circuit is entered by the testing apparatus driving the pad 20 to a second logic level, and driving the $\overline{\text{ENABLE}}$ signal to a logic 0. The first mapping circuit 22 then decouples the pad 14 from the conductive path A, and drives the conductive path A with a fixed voltage VREF, which in one embodiment of the invention is a logic level. Also in response to the second logic level and $\overline{\text{ENABLE}}$, the second mapping circuit 24 couples the pad 14 to the circuit B via the conductive path B. The second mapping circuit 24 may also decouple the pad 12 from the conductive path B, and thus from the circuit B, although such decoupling is often unnecessary. Thus, in the test mode of operation, the testing apparatus can drive the circuit B, which is driven by pad 12 in the first mode of operation, by driving the unused but accessible pad 14 whenever $\overline{\text{ENABLE}}$ is logic 0.

Figure 5:
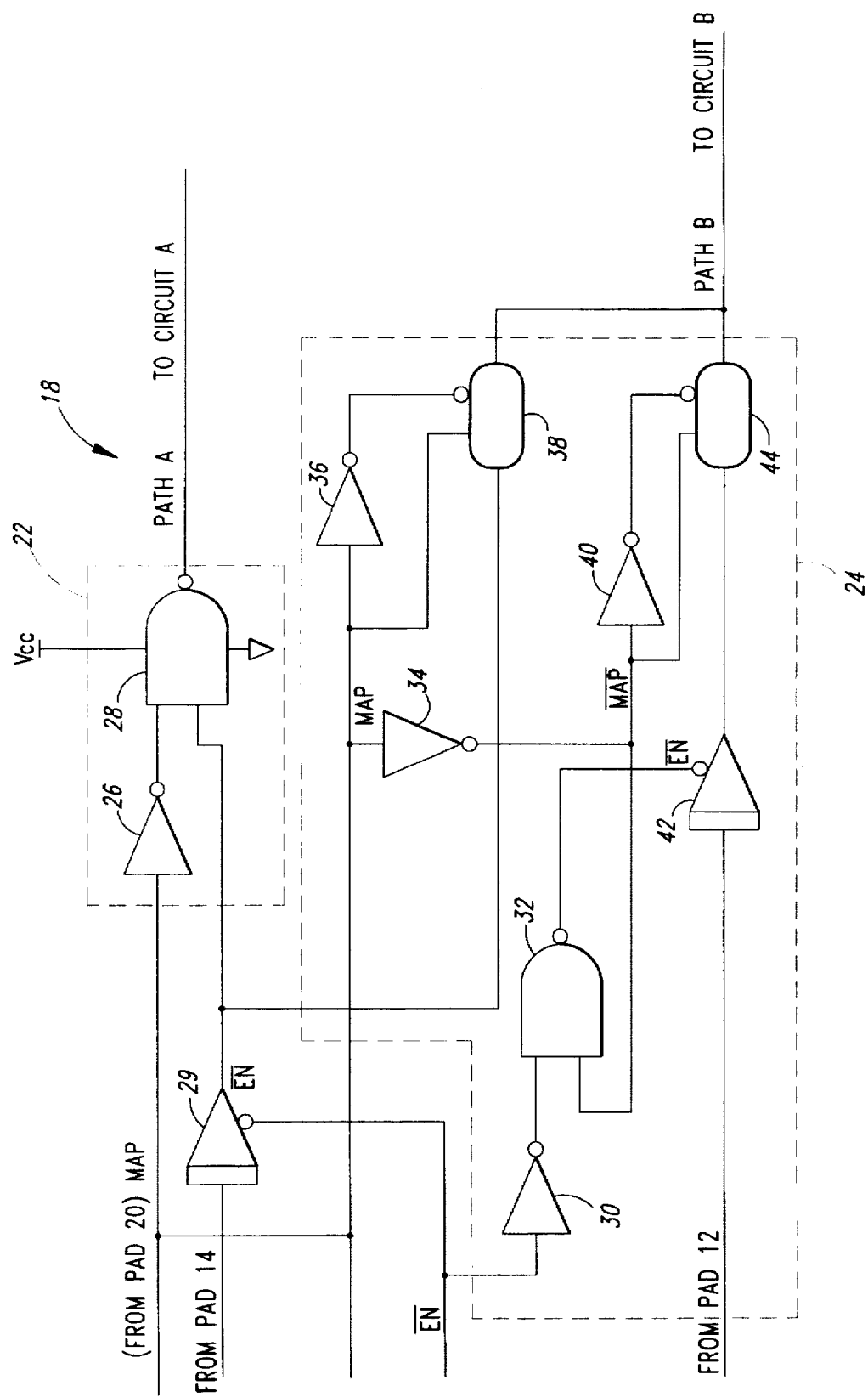
FIG. 5 is a schematic diagram of one embodiment of the configuration circuit of FIG. 4.

FIG. 5 is a schematic diagram of one embodiment of the configuration circuit 18 of FIG. 4. As shown, the first mapping circuit 22 includes an inverter 26 that has an output and an input coupled to the pad 20 for receiving a signal MAP. A NAND gate 28 has a first input coupled to the output of the inverter 26, a second input, and an output coupled to the conductive path A. The NAND gate 28 also has supply terminals that are coupled to Vcc (logic 1) and ground (logic 0). Depending upon the logic level with which the first mapping circuit 22 drives conductive path A during a test mode, either Vcc or ground is used as VREF (FIG. 4). A buffer 29 has a signal input coupled to the pad 14, a control input coupled to $\overline{\text{ENABLE}}$, and an output coupled to the second input of the NAND gate 28. Because only one buffer 29 buffers the signal from the pad 14, $\overline{\text{ENABLE}}$ is coupled to the buffer 29 instead of the first mapping circuit 22 as shown in FIG. 4. It is understood, however, that one can make various modifications to the circuit of FIG. 5 such that $\overline{\text{ENABLE}}$ is directly coupled to the first mapping circuit 22 as shown in FIG. 4. For example, the circuit 18 could include a first buffer in the first mapping circuit 22 and a second buffer in the second mapping circuit 24, where both of the buffers have signal inputs coupled to the pad 14 and control inputs coupled to $\overline{\text{ENABLE}}$.

The second mapping circuit 24 includes an inverter 30 that has an output and an input coupled to $\overline{\text{ENABLE}}$. A NAND gate 32 has a first input coupled to the output of the inverter 30, has a second input, and has an output. An inverter 34 has an input that is coupled to the pad 20, and has an output coupled to the second input of the NAND gate 32. An inverter 36 has an input coupled to the pad 20 and has an output. An electronic switch 38 has a signal input coupled to the output of the buffer 29, has first and second complementary control inputs respectively coupled to the input and the output of the inverter 36, and has an output coupled to the conductive path B. An inverter 40 has an input that is coupled to the output of the inverter 34 and has an output. A buffer 42 has a signal input coupled to the pad 12, has a control input coupled to the output of the NAND gate 32, and has an output. An electronic switch 44 has a signal input coupled to the output of the buffer 42, has first and second complementary control inputs respectively coupled to the input and the output of the inverter 40, and has an output coupled to the conductive path B.

In operation during the first or normal mode of operation, the circuit 18 couples the pad 12 to the signal conductive path B and couples the pad 14 to the signal conductive path A. MAP is driven to an inactive logic 0, typically by a circuit (not shown) formed on the die 16, as discussed above in conjunction with FIG. 4. The inverter 26 converts the logic 0 MAP to a logic 1 $\overline{\text{MAP}}$, which enables the NAND gate 28. The NAND gate 28 then acts as an inverter, and couples the conductive path A to the complement of the signal that drives the pad 14. Although not shown, the circuit A of FIG. 4 may include an inverter to generate the original signal on pad 14 from its complement on the conductive path A. The NAND gate 32, in response to the logic 1 $\overline{\text{MAP}}$ signal at one of its inputs and the logic 1 at its other input, generates at its output a logic 0 that enables the buffer 42. Furthermore, the logic 1 $\overline{\text{MAP}}$ signal and its complement, which the inverter 40 generates at its output, close the switch 44 so that it couples the pad 12 to the conductive path B via the buffer 42 whenever $\overline{\text{ENABLE}}$ is at logic 0. Finally, the logic 0 MAP, both directly and through the inverter 36, disables the switch 38 to isolate the pad 14 from conductive path B.

In operation during the second or test mode, the testing apparatus drives the pad 20, and thus MAP, to an active logic 1. The inverter 26 provides a logic 0 $\overline{\text{MAP}}$ to one of the inputs of the NAND gate 28, thereby disabling the NAND gate 28 so that conductive path A is driven with a logic 1 independently of the signal driving the pad 14. Thus, the NAND gate 28 decouples the pad 14 from the conductive path A, and holds the conductive path A at a substantially constant voltage VREF, which in this embodiment is a logic 1 derived from Vcc. The logic 1 MAP via the inverter 34 causes the NAND gate 32 to output a logic 1 which disables the buffer 42. The pad 12 is then decoupled from any other portion of the circuit 18, including conductive path B to circuit B. The logic 0 $\overline{\text{MAP}}$, both directly and via the inverter 40, opens the electronic switch 44. Thus, the switch 44 and the buffer 42 decouple the pad 12 from the conductive path B. Furthermore, the logic 1 MAP, both directly and via the inverter 36, closes the switch 38, which thus couples the pad 14 to the conductive path B via the buffer 29. Thus, during the second or test mode, the unused but accessible pad 14 is coupled to the conductive path B, and effectively substitutes for the inaccessible pad 12 whenever $\overline{\text{ENABLE}}$ is at logic 0.

It will be appreciated that, although specific embodiments of the invention have been described herein for purposes of illustration, various modifications may be made without departing from the spirit and scope of the invention. For example, although discussed with respect to configuring pad connections for normal and test operational modes, the invention may be used to configure the pads for two or more other types of operational modes with or without the use of a plurality of map signals. Also, although the circuit of FIG. 5 uses the configuration circuit 18 to configure the pads 12, 14 as inputs to the circuits A and B, it will also be understood that the pads 12, 14 may also be configured as outputs of the circuits A and B. Accordingly, the invention is not limited except as by the appended claims.

We claim:

1. An integrated device, comprising:
   a first pad;
   a second pad;
   a first circuit;
   a second circuit;
   a map signal generator operable to provide a map signal;
   a first switch circuit having a first signal terminal coupled to said first pad, a first control terminal coupled to said map signal generator, and a second signal terminal coupled to said first circuit, said first switch circuit operable to directly couple said first pad to said first circuit when said map signal has a first signal level; and
   a second switch circuit having a first signal terminal coupled to said first pad, a second signal terminal coupled to said second pad, a first control terminal coupled to said map signal generator, and a third signal terminal coupled to said second circuit, said second switch circuit operable to directly couple said second pad to said second circuit when said map signal has said first level signal said second switch circuit operable to directly couple said first pad to said second circuit and uncouple said second pad from said second circuit when said map signal has a second signal level.

2. The integrated device of claim 1 wherein said first switch circuit comprises a third signal terminal coupled to a reference terminal.

3. The integrated device of claim 1 wherein said first switch circuit comprises a third signal terminal coupled to a supply terminal.

4. The integrated device of claim 1, further comprising:
   an enable signal generator; and
   wherein said first and second switch circuits each include a respective second control terminal that is coupled to said enable signal generator.

5. The integrated device of claim 1, further comprising a buffer interposed between said first pad and said first signal terminals of said first and second switch circuits respectively, said buffer having an input coupled to said first pad and having an output coupled to said first signal terminals.

6. The integrated device of claim 1, further comprising:
   an enable signal generator; and
   a buffer interposed between said first pad and said first signal terminals of said first and second switch circuits respectively, said buffer having an input coupled to said first pad, an output coupled to both of said first signal terminals, and a control input coupled to said enable signal generator.

7. The integrated device of claim 1, further comprising an inverter interposed between said first pad and said first signal terminals of said first and second switch circuits respectively, said inverter having an input coupled to said first pad and having an output coupled to said first signal terminals.

8. The integrated device of claim 1 wherein said first and second pads comprise input pads.

9. A semiconductor wafer, comprising:
   one or more dies each having a first side accessible to a testing apparatus and each having a second side substantially inaccessible to said testing apparatus during a testing procedure, each of said dies comprising,
   a first pad disposed on said first side,
   a second pad disposed on said second side,
   a test signal generator operable to provide a test signal;
   a first circuit,
   a second circuit,
   a first switching device having a first signal terminal coupled to said first pad, a first control terminal coupled to said test signal generator, and a second signal terminal coupled to said first circuit, said first switching device operable to directly couple said first pad to said first circuit when said test signal has a first signal level, and
   a second switching device having a first signal terminal coupled to said first pad, a second signal terminal coupled to said second pad, a first control terminal coupled to said test signal generator, and a third signal terminal coupled to said second circuit, said second switching device operable to directly couple said second pad to said second circuit when said test signal has said first signal level, said second switching device operable to directly couple said first pad to said second circuit and uncouple said second pad from said second circuit when said test signal has a second signal level.

10. The wafer of claim 9 wherein:

each of said dies further comprises a supply terminal on said first side; and said first switching device comprises a third signal terminal coupled to said supply terminal.

11. The wafer of claim 9 wherein:

each of said dies further comprises an enable signal generator; and said first and second switching devices each include a respective second control terminal that is coupled to said enable signal generator.

12. The wafer of claim 9 wherein:

each of said dies further comprises a buffer interposed between said first pad and said first signal terminals of said first and second switching devices respectively; and said buffer has an input coupled to said first pad and has an output coupled to said first signal terminals.

13. The wafer of claim 12 wherein:

each of said dies further comprises an enable signal generator; and said buffer has a control input coupled to said enable signal generator.

14. The wafer of claim 13 wherein said buffer comprises an inverter.

15. The wafer of claim 9 wherein said first and second pads comprise input-signal pads.

16. The integrated device of claim 1 wherein said map signal generator comprises a map pad that is operable to receive said map signal.

17. The integrated device of claim 1, further comprising:

an enable pad operable to receive an enable signal; and wherein said first and second switch circuits each include a respective second control terminal that is coupled to said enable pad.

18. The integrated device of claim 1 wherein said first switch circuit is operable to uncouple said first circuit from said first pad when said map signal has said second signal level.

19. The wafer of claim 9 wherein said test signal generator comprises a test pad that is operable to receive said test signal.

20. The wafer of claim 9 wherein:

each of said dies further comprises an enable pad that is operable to receive an enable signal; and said first and second switching devices each include a respective second control terminal that is coupled to said enable pad.

21. The wafer of claim 9 wherein said first switching device is operable to uncouple said first pad from said first circuit when said test signal has said second signal level.

* * * * *